(12) United States Patent
Ok et al.

(10) Patent No.: US 11,800,817 B2
(45) Date of Patent: Oct. 24, 2023

(54) PHASE CHANGE MEMORY CELL GALVANIC CORROSION PREVENTION

(71) Applicant: International Business Machines Corporation, Armonk, NY (US)

(72) Inventors: Injo Ok, Loudonville, NY (US); Nicole Saulnier, Slingerlands, NY (US); Kevin W. Brew, Niskayuna, NY (US); Steven Michael McDermott, Wynantskill, NY (US); Lawrence A. Clevenger, Saratoga Springs, NY (US); Hari Prasad Amanapu, Guilderland, NY (US); Adra Carr, Albany, NY (US); Prasad Bhosale, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 17/353,098

(22) Filed: Jun. 21, 2021

(65) Prior Publication Data
US 2022/0407005 A1    Dec. 22, 2022

(51) Int. Cl.
*H10N 70/00* (2023.01)
*H10N 70/20* (2023.01)

(52) U.S. Cl.
CPC ......... *H10N 70/063* (2023.02); *H10N 70/231* (2023.02); *H10N 70/826* (2023.02); *H10N 70/8413* (2023.02); *H10N 70/8828* (2023.02)

(58) Field of Classification Search
CPC .................................................. H10N 70/063
See application file for complete search history.

(56) References Cited

U.S. PATENT DOCUMENTS

| | | |
|---|---|---|
| 5,825,046 A | 10/1998 | Czubatyj et al. |
| 6,869,883 B2 | 3/2005 | Chiang et al. |
| 7,324,365 B2 | 1/2008 | Gruening-von Schwerin et al. |
| 7,422,926 B2 | 9/2008 | Pellizzer et al. |
| 8,080,439 B2 | 12/2011 | Martinez, Jr. et al. |
| 8,462,545 B2 | 6/2013 | Dennison et al. |
| 9,747,975 B2 | 8/2017 | Kuo et al. |

(Continued)

FOREIGN PATENT DOCUMENTS

| | | |
|---|---|---|
| CN | 110098325 A | 8/2019 |
| KR | 20030081900 A | 10/2003 |

OTHER PUBLICATIONS

Anonymous, "Method and Structure for Creating a Heater with an Inverse Taper Angle for Phase-Change Memory (PCM) Mushroom Cell," an IP.com Prior Art Database Technical Disclosure, IP.com IPCOM000260076D, Oct. 18, 2019, 6 pgs.

(Continued)

*Primary Examiner* — Mounir S Amer
(74) *Attorney, Agent, or Firm* — Kelli D. Morin (57) ABSTRACT

A method for forming a phase-change memory cell includes depositing a metal layer over a wafer such that the metal layer covers connection structures of the wafer. The method further includes removing a portion of the metal layer such that the connection structures of the wafer remain covered by a remaining portion of the metal layer. The method further includes forming a phase-change memory stack on a stack area of the remaining portion of the metal layer. The method further includes removing the remaining portion of the metal layer except in the stack area.

11 Claims, 6 Drawing Sheets

(56) References Cited

U.S. PATENT DOCUMENTS

| | | |
|---|---|---|
| 10,566,528 B1 | 2/2020 | El-Hinnawy et al. |
| 2007/0012956 A1 | 1/2007 | Gutsche et al. |
| 2019/0165258 A1* | 5/2019 | Peng ..................... H10N 50/80 |

OTHER PUBLICATIONS

Anonymous, "Phase Change Memory Cell with Plural Nano Heaters," an IP.com Prior Art Database Technical Disclosure, IP.com IPCOM000263592D, Sep. 15, 2020, 16 pgs.

* cited by examiner

PHASE CHANGE MEMORY CELL GALVANIC CORROSION PREVENTION

BACKGROUND

The present disclosure relates to the electrical, electronic, and computer fields. In particular, the present disclosure relates to preventing charge collection in phase-change memory (PCM) cells regardless of the structure of the PCM cells.

PCM is a type of non-volatile random-access memory used in computers and other electronic devices to store data. Unlike conventional read-access memory (e.g., dynamic read-access memory (DRAM)), which stores data as electric charge or current flows (e.g., using capacitors), PCM uses the unique phase-change properties and behavior of chalcogenide glass, which is transformable between a crystalline state and an amorphous state by heating the material, or other material with similar properties and behavior. The crystalline and amorphous states of such a material have dramatically different electrical resistivity values. The amorphous state has a high resistance, which can also be referred to as a low conductivity and can represent a binary value of 0. In contrast, the crystalline state has a low resistance, which can also be referred to as a high conductivity and can represent a binary value of 1.

SUMMARY

Embodiments of the present disclosure include a method for forming a phase-change memory cell. The method includes depositing a metal layer over a wafer such that the metal layer covers connection structures of the wafer. The method further includes removing a portion of the metal layer such that the connection structures of the wafer remain covered by a remaining portion of the metal layer. The method further includes forming a phase-change memory stack on a stack area of the remaining portion of the metal layer. The method further includes removing the remaining portion of the metal layer except in the stack area.

Additional embodiments of the present disclosure include a computer program product comprising a computer readable storage medium having program instructions embodied therewith, the program instructions being executable by a computer system to cause the computer system to perform a method for forming a phase-change memory cell. The method includes depositing a metal layer over a wafer such that the metal layer covers connection structures of the wafer. The method further includes removing a portion of the metal layer such that the connection structures of the wafer remain covered by a remaining portion of the metal layer. The method further includes forming a phase-change memory stack on a stack area of the remaining portion of the metal layer. The method further includes removing the remaining portion of the metal layer except in the stack area.

Additional embodiments of the present disclosure include a method for forming a phase-change memory cell. The method includes depositing a metal layer over a wafer such that the metal layer covers connection structures of the wafer. The method further includes removing a portion of the metal layer such that the connection structures of the wafer remain covered by a remaining portion of the metal layer. The method further includes performing at least one of a chemical-mechanical planarization, reactive ion etching, or wet etching process on the wafer. The method further includes removing the remaining portion of the metal layer except in the stack area.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Aspects of the present disclosure relate generally to the electrical, electronic, and computer fields. In particular, the present disclosure relates to mushroom phase-change memory (PCM) cells without structural dependency. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, developments are being made in the technologies of non-volatile memory devices that can be used for analog computing such as, for example, a neural net. Some such non-volatile memory elements include resistive random-access memory (RRAM), phase-change memory (PCM), and electrochemical random-access memory (ECRAM). Such elements may be inserted into back-end test vehicles with underlying wiring of front-end-of-line of transistors.

In non-volatile memory devices, the resistive value, which can be binary ('1' or '0') or analog (e.g., 0.65), is stored in the memory cell as a function of the cell's electrical resistance. As noted above, phase-change material that is in the amorphous state has a high resistance compared to phase-change material that is in the crystalline state. More specifically, the range of resistance values of a phase-change material is bounded by a "set state" having a "set resistance" and a "reset state" having a "reset resistance." The set state is a low resistance structural state whose electrical properties are primarily controlled by the crystalline portion of the phase-change material, and the reset state is a high resistance structural state whose electrical properties are primarily controlled by the amorphous portion of the phase-change material. In other words, the set state can also be referred to as the crystalline state and/or a low resistance state. In contrast, the reset state can also be referred to as the amorphous state and/or a high resistance state.

Accordingly, in PCM devices, the relative amounts of phase-change material that are in the amorphous state and in the crystalline state within the PCM cell affect the electrical resistance of the PCM cell. This electrical resistance can be measured by passing a current through the PCM cell, and the measured electrical resistance can be converted into a value. Thus, the state of the material can be readily sensed to indicate data.

To change the resistance state of the phase-change material, the ratio of crystalline material to amorphous material is changed. In particular, phase-change materials, like chalcogenide-based materials and similar materials, can be caused to change phase by application of electrical current at levels suitable for implementation in integrated circuits.

Changing the phase-change material from the amorphous state to the crystalline state is generally a lower current operation. In contrast, changing the phase-change material from the crystalline state to the amorphous state is generally a higher current operation, which includes a short high current density pulse to melt or break down the crystalline structure, after which the phase-change material cools quickly, quenching the phase-change process, such that at least a portion of the phase-change structure stabilizes in the amorphous state. It is desirable to minimize the magnitude of the reset current used to cause the transition of the phase-change material from the crystalline state to the amorphous state. One way to reduce the magnitude of the reset current needed for reset is by reducing the size of the phase-change material element in the cell and of the contact area between electrodes and the phase-change material, so that higher current densities are achieved with smaller absolute current values through the phase-change material element.

PCM devices are good candidates for accelerating inference applications because the phase-change properties, namely the ability to transform various amounts of the material, enable the achievement of a number of distinct intermediary resistive states. Accordingly, such devices have the ability to store multiple resistive states, and therefore multiple bits, in a single cell. Cells having this ability may be referred to as multilevel cells. PCM devices are also attractive for accelerating deep learning applications because of the fast switching time and scalability enabled by the phase-change properties discussed above.

One limitation of current PCM technology is that homogenous processing of each individual element within a chip is required for high yield and neural net inference/training applications. More specifically, during fabrication, in order for the connect structures to form properly, they must be produced as part of a relatively uniform pattern having a relatively uniform density across a large area. Only a small portion of the connect structures, which may be referred to as "active" structures, are electrically connected in the chip. The remaining connect structures, which may be referred to as "dummy" structures, are not electrically connected and instead are included to aid in the structural formation of the active structures.

Because only the active structures are electrically connected in the chip, the active structures are more susceptible to galvanic corrosion during fabrication processes such as those performed during formation of a heater, a mushroom germanium-antimony-tellurium (GST), and/or a top electrode. In particular, insertion of PCM elements in one-transistor-one-resistor (1T1R) structures may result in antenna issues wherein underlying wiring stores charge that was incidentally generated during wet chemical etching or cleaning processes (WET), CMP, RIE, or other semiconductor fabrication processes. This can lead to galvanic corrosion of the active structure.

An active structure among many dummy structures may be subjected to more concentrated effects of fabrication processes via the electrical connection of the active structure to an outside structure, such as a test pad. A particular memory element associated with the active structure then suffers more aggressive corrosion, and as a result, its on/off ratio may be restricted. As a particular example, PCM mushroom structures having a single bottom connection surrounded by many dummy connection structures may experience galvanic corrosion resulting in disruption to the electrical measurement. This may cause an undercutting of the PCM. As a result, some elements may not be able to be programmed sufficiently to their target values.

Embodiments of the present disclosure may overcome these and other drawbacks of existing solutions by electrically connecting both the active structures and the dummy structures during fabrication. As discussed in further detail below, such embodiments induce local shorting to prevent such galvanic corrosion by distributing a disruptive charge rather than leaving the charge to be concentrated on active connection structures. Such embodiments facilitate improved processing efficiency, saving resources including time and money.

More specifically, embodiments of the present disclosure employ intentional local shorting, such as, for example, with an interfacial conductive layer, to prevent concentrated galvanic corrosion by distributing incidental charges. For example, in accordance with some embodiments of the present disclosure, the charging effect on one connection structure is prevented by connecting heater metal layers of all connection structures during the formation of the heater metal layer of the active structure. Preventing the damage to active structures due to concentrated galvanic corrosion by distributing incidental charges improves chip production efficiency.

Figure 1:
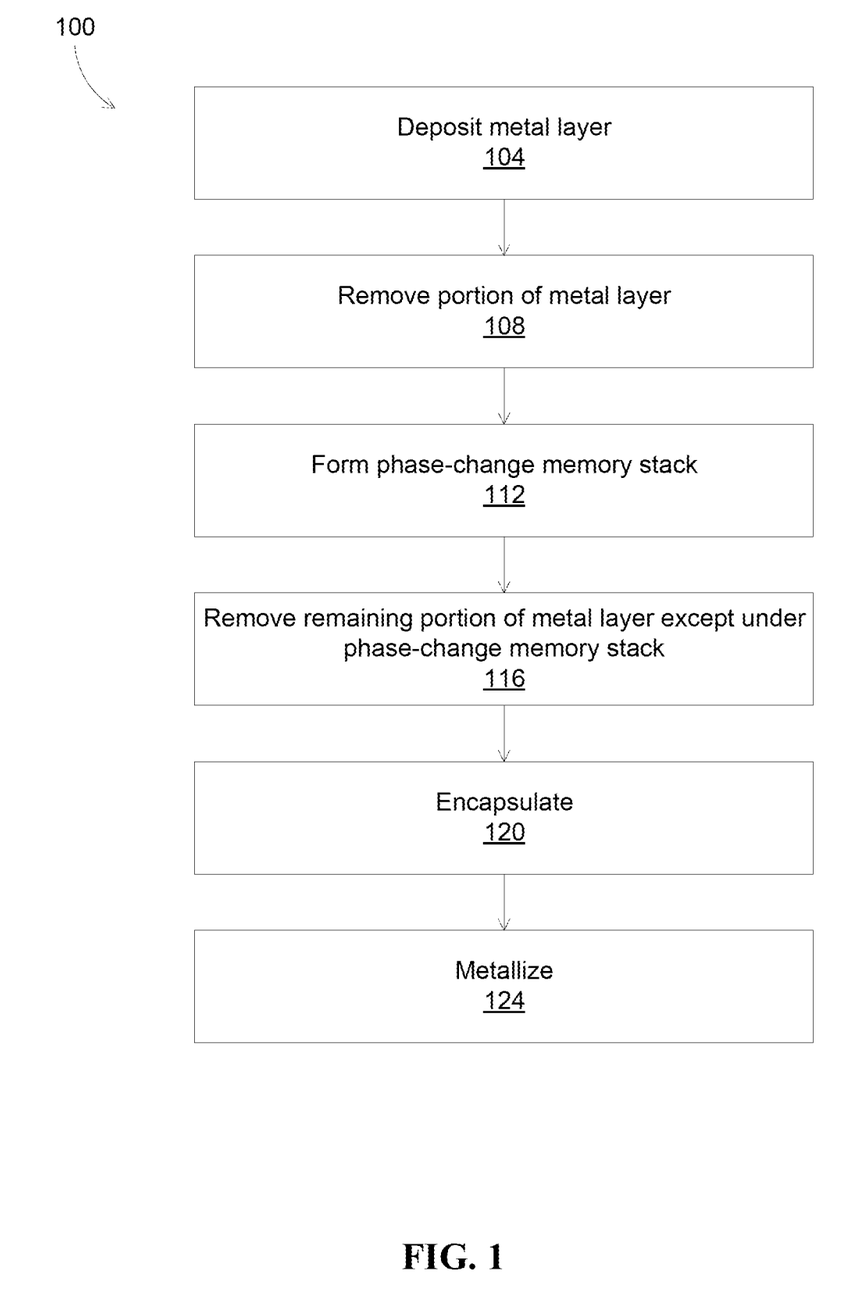
FIG. 1 illustrates a flowchart of an example method for forming a phase-change memory cell, in accordance with embodiments of the present disclosure.

FIG. 1 depicts a flowchart of an example method 100 for forming a phase-change memory cell, according to embodiments of the present disclosure. The method 100 begins with operation 104, wherein a metal layer is deposited. More specifically, the metal layer is deposited over a wafer such that the metal layer covers connection structures of the wafer.

Figure 2A:
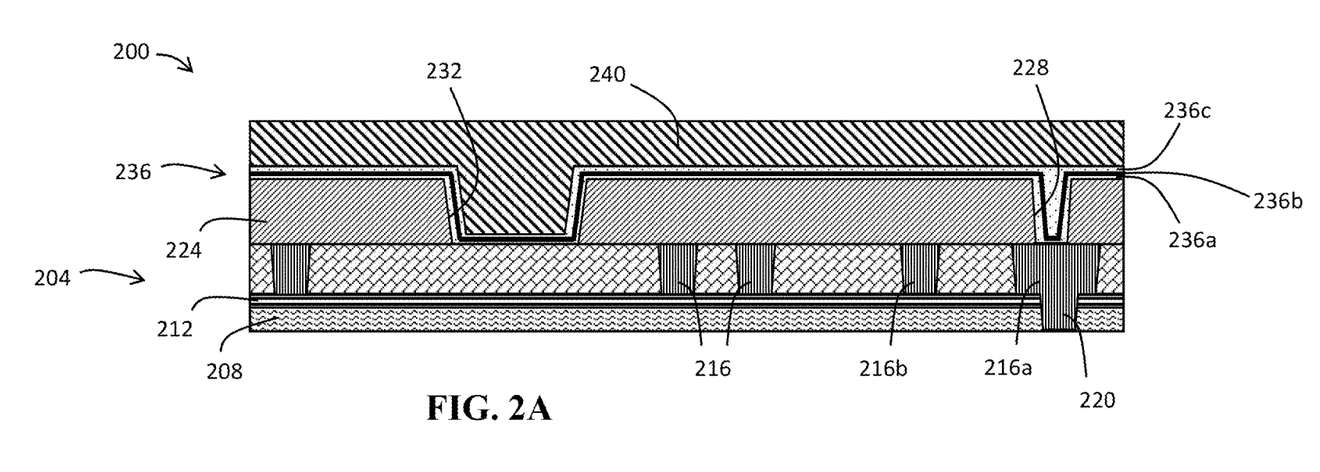
FIG. 2A illustrates an example of a device following the performance of a portion of the example method of FIG. 1, in accordance with embodiments of the present disclosure.

FIG. 2A depicts an example structure 200 following the performance of operation 104 of the method 100. As shown in FIG. 2A, the structure 200 includes the wafer 204. In accordance with at least some embodiments of the present disclosure, the wafer 204 is a partially fabricated integrated circuit chip. The wafer 204 includes a substrate 208, an insulative layer 212, and an array of connection structures 216. The substrate 208 may be formed of, for example, silicon. The insulative layer 212 may be formed of, for example, silicon nitride. The connection structures 216 may be formed of, for example, copper. The connection structures 216 include at least one active structure 216a and at least one dummy structure 216b. The active structures 216a and/or the dummy structures 216b may be referred to herein individually or collectively as connection structures 216.

The at least one active structure 216a is configured to be connected to a bottom electrode of the phase-change memory cell such that the active structure 216a is electrically connected in the chip. Accordingly, the active structure 216a is electrically connected to a via (also referred to herein as a bottom electrode) 220, which extends through the insulative layer 212 and the substrate 208. In contrast, the at least one dummy structure 216b is not configured to be connected to the bottom electrode of the phase-change memory cell such that the dummy structures 216b are not electrically connected in the chip. Accordingly, the dummy structures 216b are not electrically connected to any structures extending through the insulative layer 212 and the substrate 208. Instead, the dummy structures 216b terminate on top of the insulative layer 212.

The wafer 204 further includes an additional insulative layer 224, which is formed on top of the connection structures 216. The additional insulative layer 224 may be formed of, for example, silicon nitride. The additional insulative layer 224 includes a first hole 228 and a second hole 232 which are formed so as to extend through the additional insulative layer 224.

More specifically, the first hole 228 is formed in the additional insulative layer 224 so as to be aligned with the active structure 216a. The first hole 228 extends through the entire additional insulative layer 224 to expose the active structure 216a through the additional insulative layer 224. In contrast, the second hole 232 also extends through the additional insulative layer 224 but is not aligned with any connective structure 216.

In accordance with operation 104 of the method 100, the metal layer 236 is deposited over the entire wafer 204. Accordingly, the metal layer 236 covers the additional insulative layer 224, thereby covering the connective structures 216. The metal layer 236 is also deposited into the first hole 228 and the second hole 232.

In accordance with at least one embodiment of the present disclosure, depositing the metal layer in operation 104 includes depositing a first sublayer 236a on top of the wafer, a second sublayer 236b on top of the first sublayer 236a, and a third sublayer 236c on top of the second sublayer 236b. The first sublayer 236a can be, for example, tantalum nitride. The first sublayer 236a can have a thickness that is, for example, in a range of approximately 2 nanometers to approximately 10 nanometers. In a particular example, the first sublayer 236a can have a thickness of approximately 5 nanometers. The second sublayer 236b can be, for example, titanium nitride. The second sublayer 236b can have a thickness that is, for example, in a range of approximately 2 nanometers to approximately 10 nanometers. In a particular example, the second sublayer 236b can have a thickness of approximately 6.6 nanometers. The third sublayer 236c can be a high resistance dielectric or metal material having a thickness of, for example, in a range of approximately 10 nanometers to approximately 100 nanometers. In a particular example, the third sublayer 236c can be tantalum nitride. In a particular example, the third sublayer 236c can have a thickness of approximately 20 nanometers. In any of such embodiments, depositing each of the first, second, and third sublayers can include depositing the sublayers by ALD.

As shown in FIG. 2A, the first hole 228 is sized and configured such that depositing the metal layer 236 into the first hole 228 fills the first hole 228. In contrast, the second hole 232 is sized and configured such that depositing the metal layer 236 into the second hole 232 does not fill the second hole 232 but coats the sides and bottom of the second hole 232.

In accordance with at least one embodiment of the present disclosure, operation 104 can further include depositing a layer of tungsten 240 on top of the metal layer 236. In such embodiments, depositing the layer of tungsten 240 can include depositing the tungsten by EVD. As shown in FIG. 2A, depositing the layer of tungsten 240 fills the remainder of the second hole 232 with tungsten. As explained in further detail below, filling the second hole 232 with tungsten enables the formation of a topographical feature for use in the performance of subsequent operations of the method 100.

Returning to FIG. 1, operation 108 of the method 100 includes removing a portion of the metal layer. More specifically, a portion of the metal layer is removed from the top surface downwardly. In other words, the portion of the metal layer is removed so as to reduce the thickness of the metal layer. Accordingly, the remaining portion of the metal layer 236 still covers the additional insulative layer 224, and therefore still covers the connective structures 216. In accordance with at least one embodiment of the present disclosure, removing the portion of the metal layer can include performing a CMP procedure.

Notably, the metal layer that fills the first hole is not removed during the performance of operation 108. Additionally, removing the portion of the metal layer 236 at operation 108 necessarily includes removing the layer of tungsten 240 that is arranged on top of the metal layer 236. However, the tungsten that fills the second hole 232 also is not removed during the performance of operation 108.

In accordance with at least one embodiment of the present disclosure, performing operation 108 includes removing only a portion of the third sublayer 236c of the metal layer 236. In such embodiments, the thickness of the third sublayer may be reduced, for example, from approximately 30 nanometers to approximately 10 nanometers. In accordance with at least one alternative embodiment of the present disclosure, performing operation 108 includes removing all of the third sublayer 236c of the metal layer 236. In such embodiments, the thickness of the third sublayer may be reduced, for example, from approximately 30 nanometers to approximately zero nanometers.

In all embodiments, removing the portion of the metal layer 236 in operation 108 does not include removing any of the second sublayer 236b or any of the first sublayer 236a of the metal layer 236. In other words, the removal of the portion of the metal layer 236 stops at or above the top of the second sublayer 236b. The remaining portion of the metal layer connects the entire wafer. In other words, the entire wafer is intentionally shorted by the remaining portion of the metal layer 236. This intentional short prevents the concentration of charges generated during subsequent operations of the method 100 on the active structure 216a, and therefore prevents galvanic corrosion of the active structure 216a.

Figure 2B:
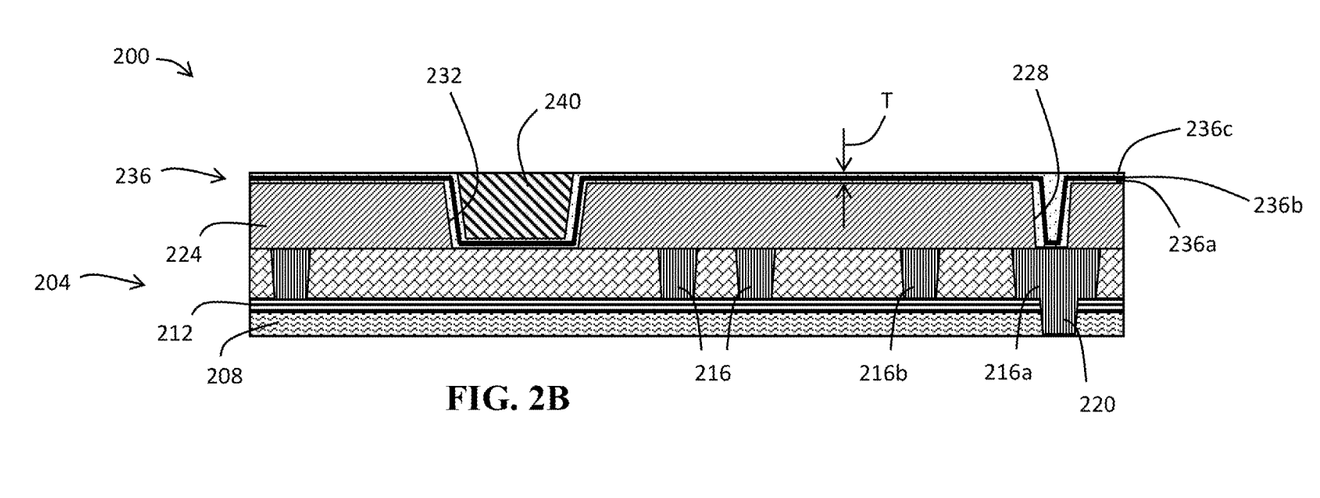
FIG. 2B illustrates an example of a device following the performance of a portion of the example method of FIG. 1, in accordance with embodiments of the present disclosure.

FIG. 2B depicts an example of the structure 200 following the performance of operation 108. The thickness of the metal layer 236 is indicated with the reference character T. This thickness is reduced relative to the thickness of the metal layer 236 prior to the performance of operation 108. As shown, the portion of the metal layer 236 that fills the first hole 228 is not impacted by the performance of operation 108. The portion of the metal layer 236 that fills the first hole 228 will form a heater for the phase-change material cell. In particular, during use of the phase-change material memory cell, current will be passed through the portion of the metal layer 236 that fills the first hole 228 to generate heat that will affect the phase of the phase-change material to store data therein.

Operation 112 of the method 100 includes forming a phase-change memory stack on a stack area of the remaining portion of the metal layer. In particular, the phase-change memory stack is aligned with the first hole and, therefore, with the active structure. This arrangement will enable use of the phase-change memory cell as current will travel through the active structure, through the heater, and into the phase-change memory stack.

Performing operation 112 includes the performance of several sub-operations to form the phase-change memory stack. In particular, in accordance with at least one embodiment of the present disclosure, operation 112 includes forming a sacrificial nitride (SacN) layer 256 on top of the remaining metal layer 236, a lithography hardmask organic planarization layer (OPL) 252 on top of the SacN layer 256, and a silicon containing anti-reflective coating (SiARC) 248 layer on top of the OPL 252. The SacN layer, OPL, and SiARC layer can be formed, for example, by deposition.

Operation 112 can further include forming a photoresist layer 244 on a portion of the SiARC layer 248. The photoresist layer 244 is aligned over the first hole 228 (and therefore the active structure) as well as an adjacent area. Accordingly, in at least some embodiments, the photoresist layer 244 will cover the active structure 216a as well as at least one dummy structure 216b.

Figure 2C:
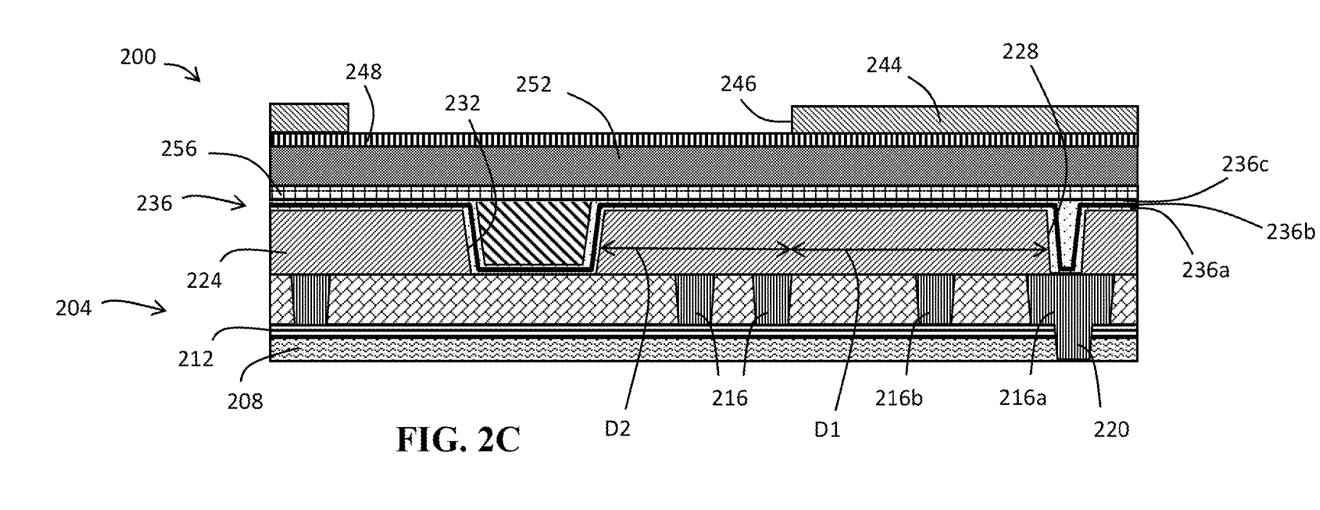
FIG. 2C illustrates an example of a device following the performance of a portion of the example method of FIG. 1, in accordance with embodiments of the present disclosure.

FIG. 2C depicts an example of the structure 200 following the performance of these sub-operations of operation 112. As shown, the photoresist layer 244 is formed on a portion of the SiARC layer 248 so as to extend to an edge 246 that is arranged a first distance D1 from a position aligned with the first hole 228. The edge 246 is also arranged a second distance D2 from a position aligned with the second hole 232. As described in further detail below, this particular configuration and arrangement of the photoresist layer 244, and particularly of the edge 246 of the photoresist layer 244, contributes to the formation of the topographical feature for use in the performance of subsequent operations of the method 100.

Performing operation 112 further includes sub-operations of patterning and RIE of the SiARC layer 248, OPL 252, and SacN layer 256. In accordance with at least one embodiment, performing the ME includes performing a silicon nitride and SiARC etch. As noted above, the performance of the RIE is an action that could lead to the generation of an unintentional charge. However, because the remaining portion of the metal layer still connects the entire wafer, the impact of such a charge on the active structure is prevented.

Figure 2D:
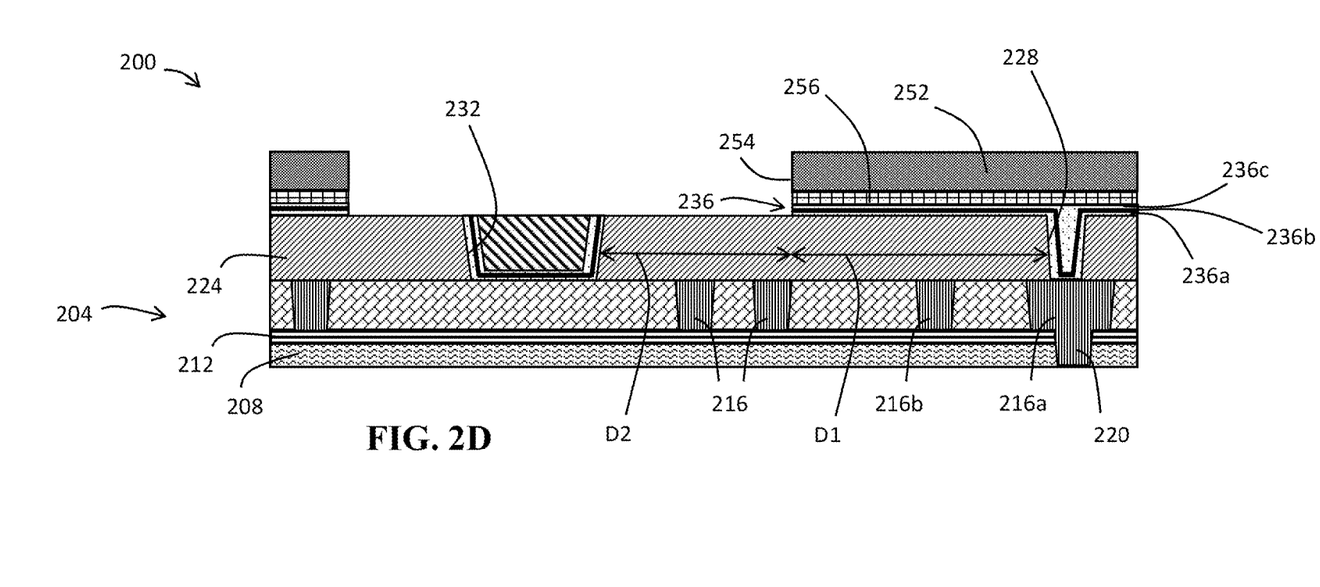
FIG. 2D illustrates an example of a device following the performance of a portion of the example method of FIG. 1, in accordance with embodiments of the present disclosure.

FIG. 2D depicts an example of the structure 200 following the performance of these sub-operations of operation 112. As shown, the OPL 252 and SacN layer 256 only remain where the photoresist had been arranged. Therefore, the OPL 252 extends to an edge 254 that is aligned with the position where the edge 246 of the photoresist layer 244 had been arranged. Moreover, the remaining portion of the metal layer 236 also only remains where the photoresist had been arranged. Therefore, the remaining portion of the metal layer 236 also extends to the edge 254.

While the remaining portion of the metal layer is reduced in the horizontal dimension that is visible in the cross-sectional view depicted in FIG. 2D, the remaining portion of the metal layer also still extends in the depth dimension that is not visible in the cross-sectional view depicted in FIG. 2D. Accordingly, while some areas of the wafer are opened up down to the additional insulative layer 224 by the patterning and RIE, the intentional shorting effect of the remaining portion of the metal layer 236 is still accomplished. The remaining portion of the metal layer 236 still connects the active structure 216a to dummy structures as well as adjacent chips.

Opening up some areas of the wafer in this manner facilitates the performance of further sub-operations of operation 112. In particular, operation 112 further includes performing an additional RIE to remove the remaining OPL 252 as well as to create depressions in the additional insulative layer 224. As noted above, the performance of the additional RIE is an action that could lead to the generation of an unintentional charge. However, because the remaining portion of the metal layer 236 still connects the active structure 216a to dummy structures 216b as well as adjacent chips, the impact of such a charge on the active structure 216a is still prevented.

Figure 2E:
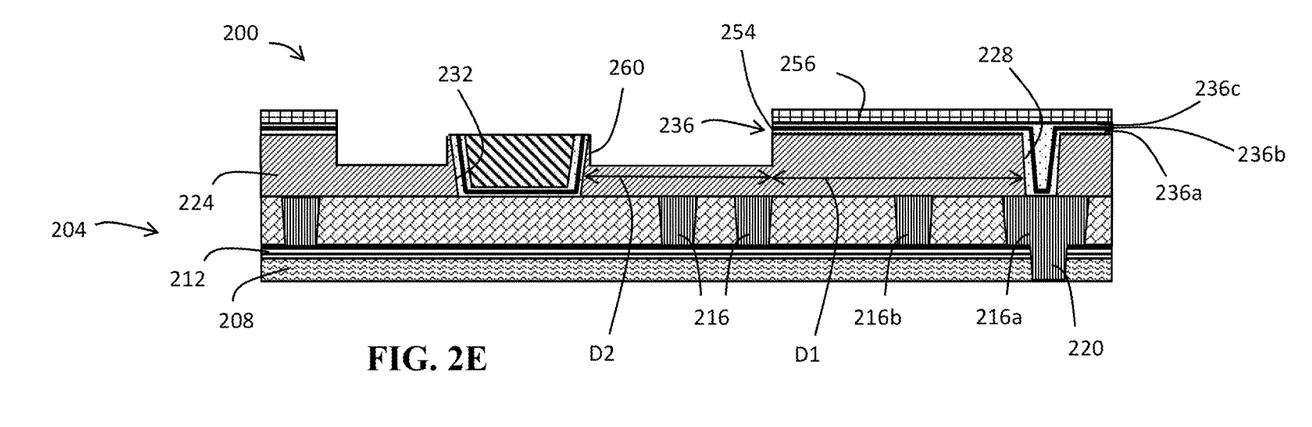
FIG. 2E illustrates an example of a device following the performance of a portion of the example method of FIG. 1, in accordance with embodiments of the present disclosure.

FIG. 2E depicts an example of the structure 200 following the performance of this sub-operation of operation 112. Notably, the masking effect provided by the remaining OPL 252 as well as the structure provided by the remaining tungsten that filled the second hole 232 cause a depression 260 to be formed between the edge of the remaining tungsten 240 and the edge 254 to which the remaining portion of the metal layer 236 extends. This depression 260 enables the formation of the topographical feature for use in the performance of subsequent operations of the method 100.

Performing operation 112 further includes a sub-operation of WET etching to remove the remaining SacN layer 256. As noted above, the performance of this WET etching is an action that could lead to the generation of an unintentional charge. However, because the remaining portion of the metal layer still connects the active structure to dummy structures as well as adjacent chips, the impact of such a charge on the active structure is prevented.

Figure 2F:
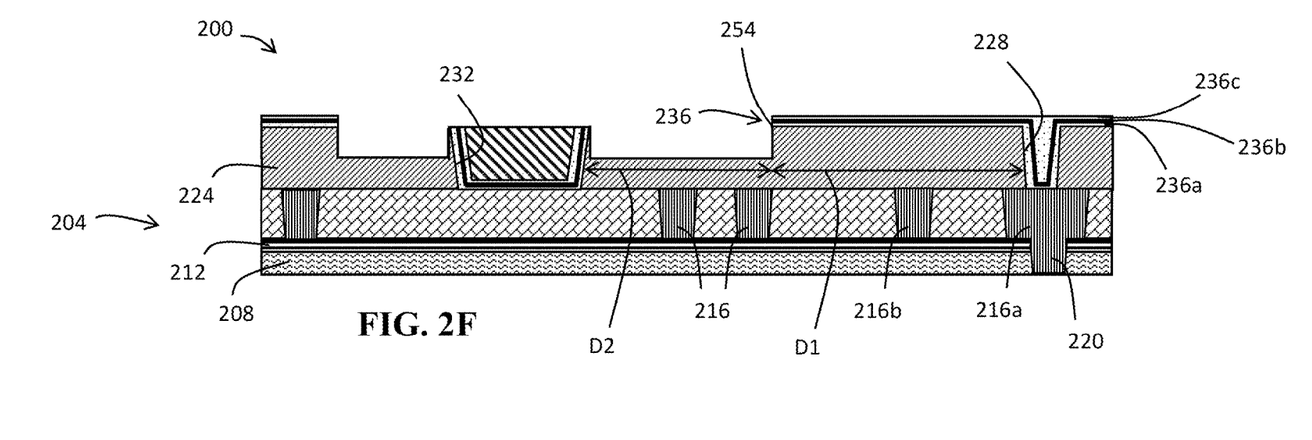
FIG. 2F illustrates an example of a device following the performance of a portion of the example method of FIG. 1, in accordance with embodiments of the present disclosure.

FIG. 2F depicts an example of the structure 200 following the performance of this sub-operation of operation 112.

Performing operation 112 further includes sub-operations of depositing the GST 262 and phase-change memory stack materials and depositing a photoresist layer. In accordance with at least one embodiment of the present disclosure, the phase-change memory stack materials include a layer of titanium nitride 264 deposited on top of the GST 262 and a layer of silicon nitride 266 deposited on top of the layer of titanium nitride 264. Due to the presence of the depression 260, depositing these materials forms an alignment depression 270 in the top surface of the deposited materials. This alignment depression 270 is used as a reference point to indicate the location for the deposition of the photoresist layer 272. In particular, using the alignment depression 270 as a reference point, the photoresist layer 272 is deposited in a location that is aligned with the first hole 228 and the active structure 216a. In other words, the alignment depression 270 is the topographical feature which enables the deposition of the photoresist layer 272 in the correct position above the first hole 228 and the active structure 216a.

Figure 2G:
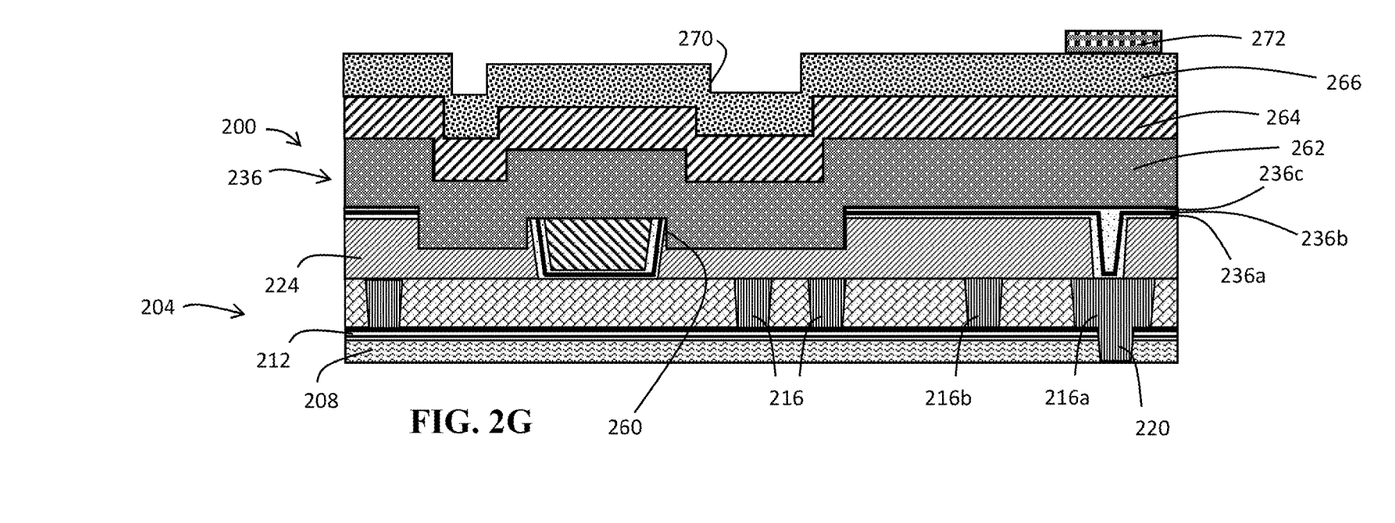
FIG. 2G illustrates an example of a device following the performance of a portion of the example method of FIG. 1, in accordance with embodiments of the present disclosure.

FIG. 2G depicts an example of the structure 200 following the performance of this sub-operation of operation 112.

Operation 116 of the method 100 includes removing the remaining portion of the metal layer 236 except in the stack area. The stack area refers to the area of all layers underneath where the photoresist layer 272 was arranged. Accordingly, the portions of the phase-change memory stack materials 264, 266, the GST 262, and the remaining portion of the metal layer 236 that were arranged underneath the photoresist layer 272 are in the stack area.

In accordance with at least one embodiment of the present disclosure, operation 116 includes etching for the GST 262 and phase-change memory stack materials 264, 266. The photoresist layer 272 functions as a hardmask for the GST 262 and phase-change memory stack materials 264, 266. Accordingly, in the performance of operation 116, the GST 262 and phase-change memory stack materials 264, 266 are removed from all areas of the wafer that are not covered by the photoresist layer 272. Additionally, operation 116 also includes removing the metal layer 236 from all areas of the wafer that are not covered by the photoresist layer 272. Accordingly, operation 116 separates all of the devices of the wafer.

Separating the devices of the wafer at this particular point in the method 100 allows the metal layer to establish and maintain the electrical connection with the other devices during the heater formation and during WET, CMP, and RIE processes, thereby preventing galvanic corrosion by intentional shorting. However, once that galvanic corrosion has been prevented and the formation of the functional structures of the device is completed, the devices of the wafer must be separated for usage of the device. Therefore, the devices of the wafer must be separated before encapsulation and metallization. Accordingly, operation 116 occurs after the phase-change memory stack has been formed on a stack area of the remaining portion of the metal layer and also occurs before encapsulating the wafer and the phase-change memory stack to form a cell and metallizing the cell to form the phase-change memory cell.

Figure 2H:
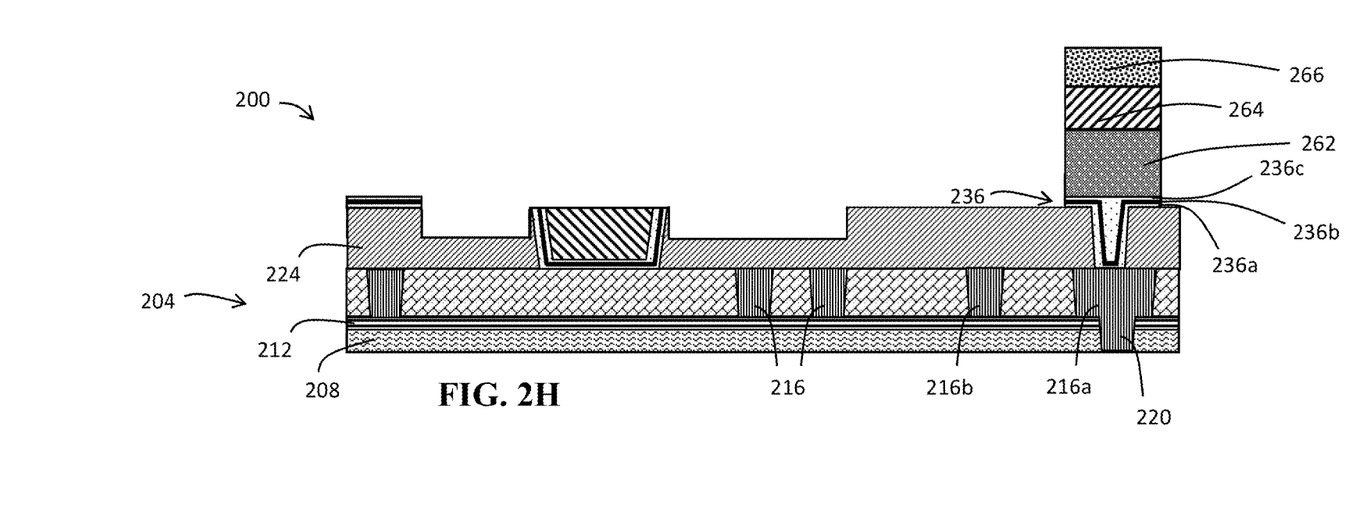
FIG. 2H illustrates an example of a device following the performance of a portion of the example method of FIG. 1, in accordance with embodiments of the present disclosure.

FIG. 2H depicts an example of the structure 200 following the performance of operation 116.

Operation 120 includes encapsulating the wafer and the phase-change memory stack to form a cell. The phase-change memory stack includes the GST 262 and phase-change memory stack materials 264, 266. In accordance with at least one embodiment of the present disclosure, operation 120 can include encapsulating a mushroom device. In accordance with at least one embodiment of the present disclosure, operation 120 includes encapsulating the wafer and the phase-change memory stack with an encapsulation layer 276. In accordance with at least one embodiment of the present disclosure, the encapsulation layer 276 can be made of, for example, silicon nitride.

Figure 2I:
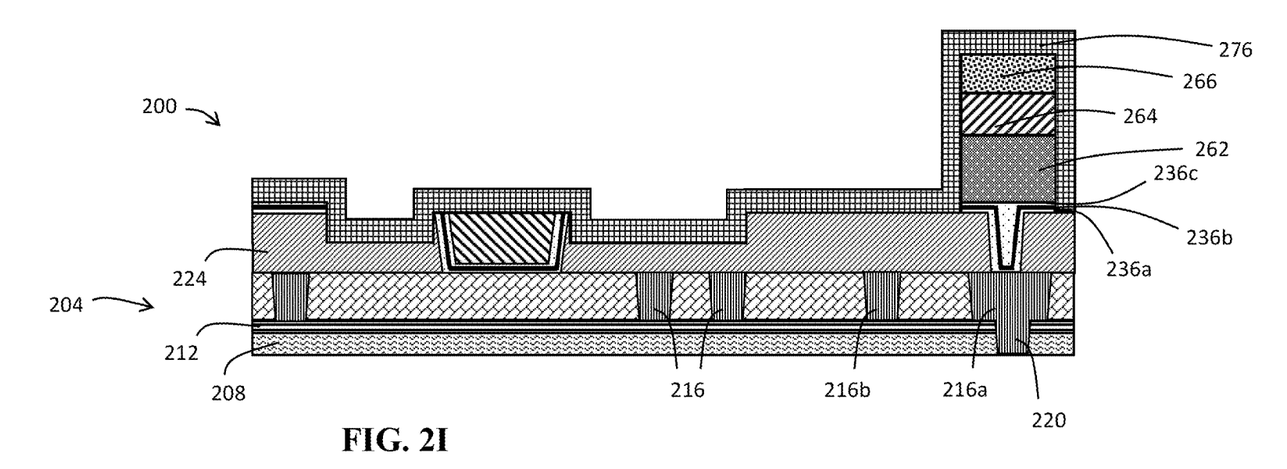
FIG. 2I illustrates an example of a device following the performance of a portion of the example method of FIG. 1, in accordance with embodiments of the present disclosure.

FIG. 2I depicts an example of the structure following the performance of operation 120.

Operation 124 includes metallizing the cell to form the phase-change memory cell. In accordance with at least one embodiment of the present disclosure, operation 124 can include encapsulating the cell with a dielectric material 280 and forming a top metal connection 282. In accordance with at least one embodiment of the present disclosure, the top metal 282 connection extends through the dielectric material 280, through the encapsulation layer 276, and into the phase-change memory stack materials 264, 266. In particular, the top metal connection 282 may extend through the silicon nitride layer 266 of the phase-change memory stack materials and into contact with the titanium nitride layer 264 of the phase-change memory stack materials. In accordance with at least one embodiment of the present disclosure, the top metal connection 282 can be made of, for example, tungsten.

In accordance with at least one embodiment of the present disclosure, the dielectric material 280 can be, for example, a low conductivity dielectric material. In accordance with at least one embodiment of the present disclosure, the dielectric material 280 can be, for example, tetraethyl orthosilicate (also known as tetraethoxysilane).

Figure 2J:
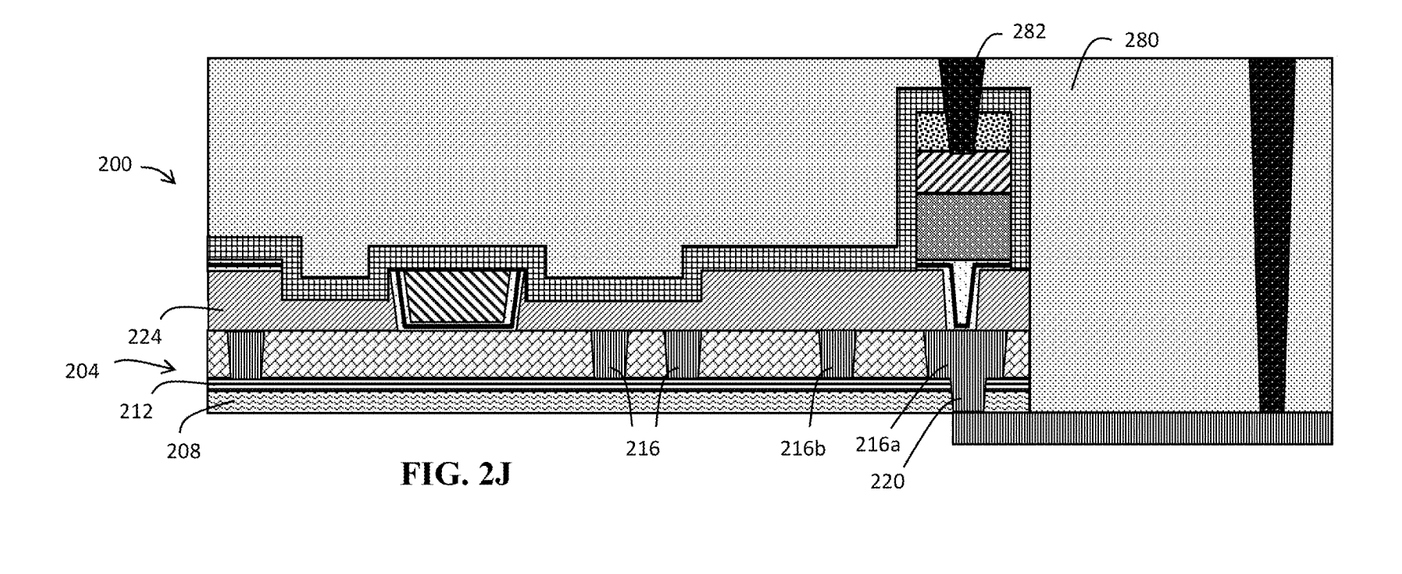
FIG. 2J illustrates an example of a device following the performance of a portion of the example method of FIG. 1, in accordance with embodiments of the present disclosure.

FIG. 2J depicts an example of the structure 200 following the performance of operation 124. In other words, FIG. 2J depicts an example of the structure 200 following the performance of method 100. In operation, current goes through the bottom electrode 220 of the structure 200 to the titanium nitride 236b, which has the lowest resistive value. The current then goes up through the phase-change memory stack. Heat is generated by the current and the interface of the remaining portion of the metal layer 236 with the GST 262.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method for forming a phase-change memory cell, the method comprising:
    depositing a metal layer over a wafer such that the metal layer covers connection structures of the wafer;
    removing a portion of the metal layer such that the connection structures of the wafer remain covered by a remaining portion of the metal layer;
    forming a phase-change memory stack on a stack area of the remaining portion of the metal layer; and
    removing the remaining portion of the metal layer except in the stack area.

2. The method of claim 1, further comprising:
    encapsulating the wafer and the phase-change memory stack to form a cell; and
    metallizing the cell to form the phase-change memory cell.

3. The method of claim 1, wherein removing a portion of the metal layer includes reducing a thickness of the metal layer.

4. The method of claim 1, wherein the metal layer includes:
    a first sublayer of tantalum nitride;
    a second sublayer of titanium nitride; and
    a third sublayer of tantalum nitride.

5. The method of claim 4, wherein removing a portion of the metal layer includes removing a portion of the third sublayer of tantalum nitride.

6. The method of claim 4, wherein removing a portion of the metal layer includes removing the third sublayer of tantalum nitride.

7. The method of claim 1, wherein the connection structures include:
    a first structure, which is configured to be connected to a bottom electrode of the phase-change memory cell; and
    a second structure, which is not configured to be connected to the bottom electrode of the phase-change memory cell.

8. The method of claim 7, wherein the stack area is aligned with the first structure.

9. The method of claim 7, wherein the wafer includes a hole that is aligned with the first structure.

10. The method of claim 9, wherein:
    depositing the metal layer includes filling the hole with the metal layer; and
    the metal layer in the hole forms a heater for the phase-change memory stack.

11. A method for forming a phase-change memory cell, the method comprising:
    depositing a metal layer over a wafer such that the metal layer covers connection structures of the wafer;
    removing a portion of the metal layer such that the connection structures of the wafer remain covered by a remaining portion of the metal layer;
    performing at least one of a chemical-mechanical planarization, reactive ion etching, or wet etching process on the wafer; and
    removing the remaining portion of the metal layer except in the stack area.

\* \* \* \* \*